United States Patent
Orbach et al.

(10) Patent No.: US 8,261,140 B2
(45) Date of Patent: *Sep. 4, 2012

(54) UNINITIALIZED MEMORY DETECTION USING ERROR CORRECTION CODES AND BUILT-IN SELF TEST

(75) Inventors: Yair Orbach, Shomron (IL); Assaf Rachlevski, Modiin (IL)

(73) Assignee: LSI Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/187,657

(22) Filed: Jul. 21, 2011

(65) Prior Publication Data

US 2011/0276846 A1    Nov. 10, 2011

Related U.S. Application Data

(63) Continuation of application No. 12/274,547, filed on Nov. 20, 2008, now Pat. No. 8,001,432.

(51) Int. Cl.
*G11C 29/00*    (2006.01)

(52) U.S. Cl. .......... 714/720; 714/722; 711/170

(58) Field of Classification Search .......... 714/718, 714/710, 711, 722, 720, 723
See application file for complete search history.

(56) References Cited

U.S. PATENT DOCUMENTS

| | | | | | |
|---|---|---|---|---|---|
| 5,335,344 | A | * | 8/1994 | Hastings | 714/35 |
| 5,504,669 | A | * | 4/1996 | Wakabayashi et al. | 700/2 |
| 5,574,849 | A | * | 11/1996 | Sonnier et al. | 714/12 |
| 5,652,580 | A | * | 7/1997 | Saxena | 341/50 |
| 5,928,370 | A | * | 7/1999 | Asnaashari | 714/48 |
| 5,930,818 | A | * | 7/1999 | Suu et al. | 711/115 |
| 6,041,001 | A | * | 3/2000 | Estakhri | 365/200 |
| 6,631,086 | B1 | * | 10/2003 | Bill et al. | 365/185.09 |
| 6,634,020 | B1 | * | 10/2003 | Bates et al. | 717/131 |
| 6,804,760 | B2 | * | 10/2004 | Wiliams | 711/170 |
| 7,158,416 | B2 | | 1/2007 | Kern | 365/185.22 |

* cited by examiner

*Primary Examiner* — Steve Nguyen
(74) *Attorney, Agent, or Firm* — Christopher P. Maiorana, PC

(57) ABSTRACT

An apparatus having a memory module and an initialization module is disclosed. The initialization module may be configured to (i) mark a particular location in the memory module as an uninitialized location by writing a predetermined word into the particular location in response to an occurrence of an event, (ii) read a read word from an address in the memory module in response to a read cycle and (iii) generate an interrupt signal by analyzing the read word, the interrupt signal being asserted where the read word indicates that the address is the uninitialized location in the memory module.

20 Claims, 8 Drawing Sheets

UNINITIALIZED MEMORY DETECTION USING ERROR CORRECTION CODES AND BUILT-IN SELF TEST

This is a continuation of U.S. Ser. No. 12/274,547, filed Nov. 20, 2008, now U.S. Pat. No. 8,001,432, which is incorporated by reference.

FIELD OF THE INVENTION

The present invention relates to logic to support software debugging generally and, more particularly, to a method and/or apparatus for implementing an uninitialized memory detection using error correction codes and built-in self test.

BACKGROUND OF THE INVENTION

Problems that stem from accessing uninitialized software code or data are often difficult to debug. The behavior of a system that executes uninitialized code, or that mistakenly interprets uninitialized data as control information, seems totally random since the set of instructions that resides in the uninitialized locations were not generated as code but either as data from previous operations and the random values that the memory contains at a wake-up from reset or power up.

Several common solutions exist to aid in software debugging. In some cases, the software is debugged with a software simulator that supports data tracking. However, the software simulators have speed limitations and do not operate well in real-time environments. In other cases, specialized hardware is used to track and identify accesses to uninitialized memory locations. However, the specialized hardware has limited access over predetermined memory ranges, is limited in the number of accesses that can be tracked simultaneously and is limited in granularity. Furthermore, managing the tracking of uninitialized data through address monitoring is complex and might impact real-time performance.

SUMMARY OF THE INVENTION

The present invention concerns an apparatus having a memory module and an initialization module. The initialization module may be configured to (i) mark a particular location in the memory module as an uninitialized location by writing a predetermined word into the particular location in response to an occurrence of an event, (ii) read a read word from an address in the memory module in response to a read cycle and (iii) generate an interrupt signal by analyzing the read word, the interrupt signal being asserted where the read word indicates that the address is the uninitialized location in the memory module.

The objects, features and advantages of the present invention include providing a method and/or apparatus for implementing an uninitialized memory detection using error correction codes and built-in self test that may (i) track any access to uninitialized code and/or data with fine granularity, (ii) provide accurate detection in address ranges having "holes" where some memory locations are initialized and some are not, (iii) works at full speed with no impact on performance during detection and/or (iv) minimize memory initialization time by using existing built-in self test circuitry.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally use multiple Error Correction Code (ECC) bits that may be attached to every memory set for various reasons (e.g., detecting soft errors) and Built-In Self Test (BIST) logic (e.g., used for testing at production) to mark one or more uninitialized regions of a memory module. The ECC protection, generally found in small geometry memory designs, may be used to detect uninitialized memory locations by marking with a predetermined ECC value. The BIST logic, which may normally be used in a test environment, generally implements a memory initialization process. A general idea is to use logic around one or more memory modules that may already be present in the circuit for other reasons, and add minimal new logic to achieve the uninitialized detection.

The initialization process may be activated following a circuit reset and/or when part or all of one or more memory modules are released due to task switching or other reasons. The initialization process may be activated by a reset circuit or by a register indicating the triggering event. A sequence of initializing all, or selective memory modules generally utilizes one or more among added logic modules, software and/or the BIST logic to set the intended ECC bits and data bits to a predetermined reserved code that represents an uninitialized flag. Advantages of using the BIST logic include, but are not limited to, (i) initializing large memories quickly since the BIST logic typically resides within or next to the memory modules, (ii) writing at least one addressable word or multi-word line every cycle and (iii) operating in several memory modules in parallel. At every memory read access, in addition to the normal ECC operation (e.g., comparing the read ECC codes with an expected ECC value), the read ECC codes and the read data (or the ECC codes alone) may be compared with the predetermined reserved code to detect accesses to uninitialized locations. The detection may interrupt a processor that subsequently captures the addresses of the problematic locations for debugging.

Figure 1:
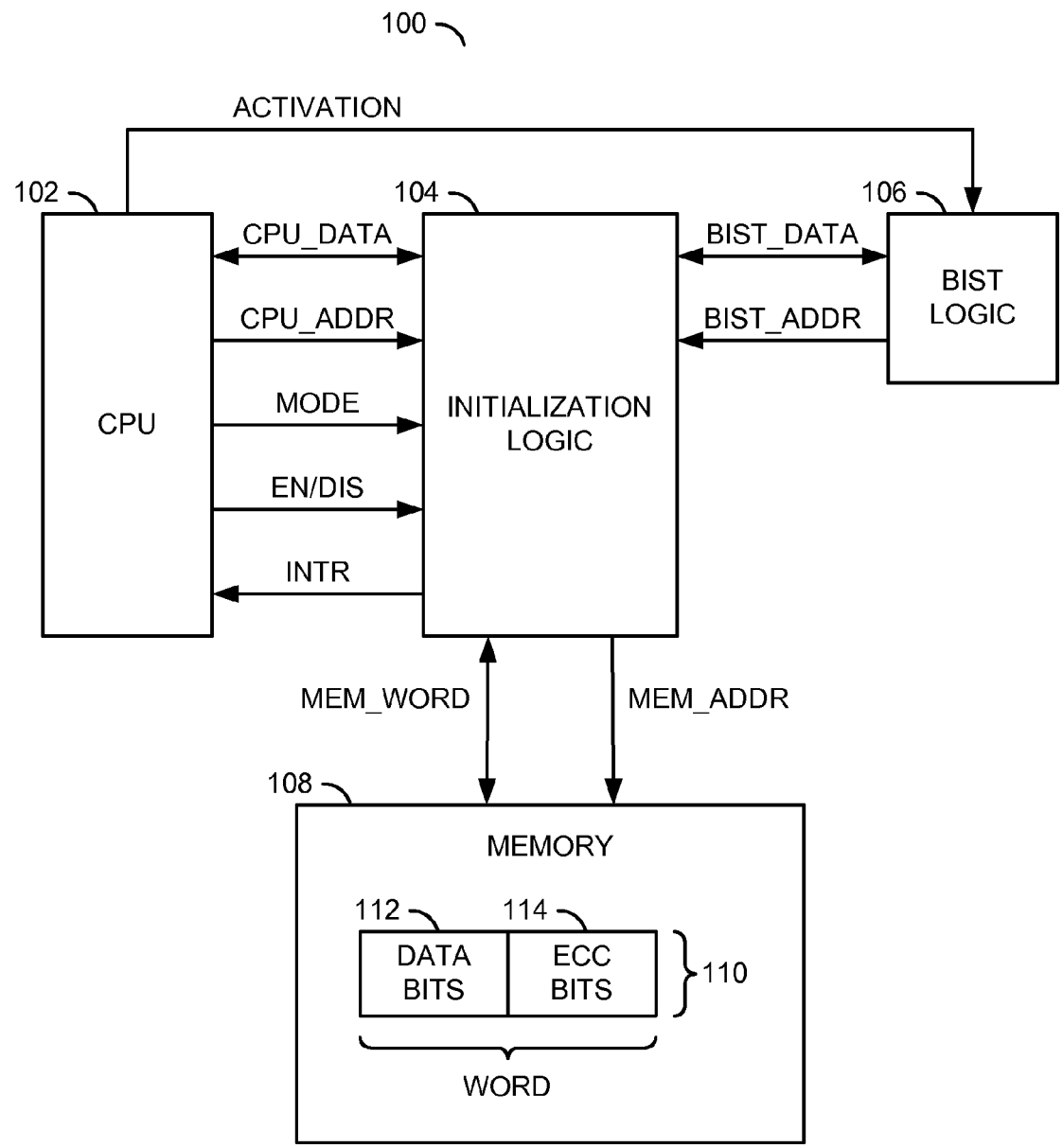
FIG. 1 is a block diagram of an apparatus in accordance with a preferred embodiment of the present invention.

Referring to FIG. 1, a block diagram of an apparatus 100 is shown in accordance with a preferred embodiment of the present invention. The apparatus (or system) 100 generally comprises a circuit (or module) 102, a circuit (or module) 104, a circuit (or module) 106 and one or more circuits (or modules) 108 (one shown for simplicity). A signal (e.g., CPU_DATA) may be exchanged between the circuit 102 and the circuit 104. A signal (e.g., CPU_ADDR) may be generated by the circuit 102 and presented to the circuit 104. The circuit 102 may also generate a signal (e.g., MODE) that is presented to the circuit 104. The circuit 104 may generate and present a signal (e.g., INTR) to the circuit 102. An optional signal (e.g., EN/DIS) may be generated by the circuit 102 and presented to the circuit 104. The circuit 106 may exchange a signal (e.g., BIST_ADDR) with the circuit 104. A signal (e.g., BIST_ADDR) may be generated by the circuit 106 and presented to the circuit 104. The circuit 106 may receive a signal (e.g., ACTIVATION) from the circuit 102. The circuit 104 may exchange a signal (e.g., MEM_DATA) with the circuit 108. A signal (e.g., MEM_ADDR) may be generated by the circuit 104 and presented to the circuit 108.

The circuit 102 may be implemented as a processor module. In some embodiments, the circuit 102 may be a central processor unit, a microprocessor, a microcontroller, a reduced instruction set processor, a complex instruction set processor and the like. The circuit 102 is generally operational to (i) read and write user data, opcode data, instruction data and command data to and from the circuit 108, (ii) control the modes of the apparatus 100 and (iii) activate initialization procedures that mark locations in the circuit 108 as uninitialized. Reading and writing to and from the circuit 108 may be conducted using the signal CPU_DATA to carry the information and the signal CPU_ADDR to carry the requested memory locations. Some or all of the modes (e.g., Initialization, BIST and Normal) of the apparatus 100 may be controlled via the signal MODE. Activation of the initialization procedure may be controlled with the signal ACTIVATION. The circuit 102 may respond to an assertion of the signal INTR by suspending normal execution of software and beginning execution of a service routine to capture any read address that accessed an uninitialized location in the circuit 108. The optional signal EN/DIS may be used to selectively enable and disable an error correction routine operating the circuit 104.

The circuit 104 may be implemented as an initialization logic module. The circuit 104 is generally operational to (i) write a predetermined word (data+ECC) into uninitialized addressable locations in the circuit 108, (ii) generate and append ECC codes to the data (e.g., user data, opcode data, instruction data, command data, etc.) being written into the circuit 108, (iii) parse the data and ECC codes from the words read from the circuit 108, (iv) detect errors in the read data, (v) correct errors in the read data and (vi) analyze each word read from the circuit 108 to detect if the read was from an uninitialized memory location or an initialized memory location. The predetermined word may be transferred to the circuit 108 via the signal MEM_DATA. The memory locations where the predetermined words are to be stored are generally conveyed to the circuit 108 in the signal MEM_ADDR.

The circuit 106 may be implemented as a built-in self test logic module. The circuit 106 is generally operational to (i) conduct testing of the apparatus 100 and (ii) perform the initialization procedures on the circuit 108 when commanded by the circuit 102. In particular, the circuit 106 may generate one or more sequences of one or more addresses in the signal BIST_ADDR that walk through addressable locations in the circuit 108 to be marked as uninitialized. In some embodiments, the circuit 106 may also present the predetermined word (data+ECC) in the signal BIST_DATA to the circuit 104 for use in marking the uninitialized address locations. In still other embodiments, the circuit 106 may present the predetermined ECC code to the circuit 104 in the signal BIST_DATA. The predetermined word may be used by the circuit 104 to detect if a just-read memory location contains uninitialized information or not.

The circuit 108 may be implemented as one or more random access memory modules. The circuit 108 generally includes multiple addressable memory locations 110 accessible by an address received via the signal MEM_ADDR. Each of the memory locations 110 may store a multi-bit word (e.g., data words, opcode words, instruction words, control word, etc.). Each word generally includes a portion for the data bits 112 and a portion for the ECC bits 114. The information words may be written into and read from the circuit 108 via the signal MEM_DATA.

Figure 2:
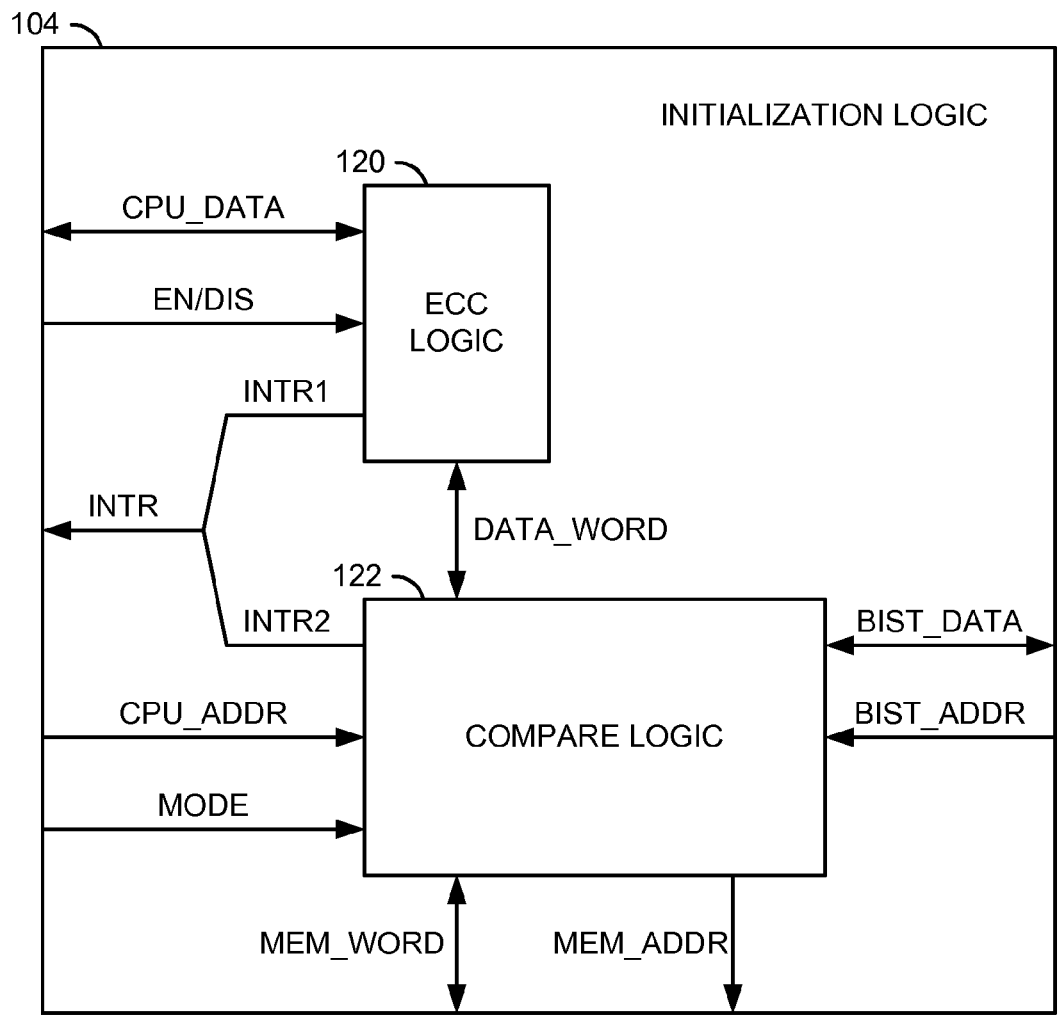
FIG. 2 is a block diagram of an example implementation of an initialization circuit.

Referring to FIG. 2, a block diagram of an example implementation of the circuit 104 is shown. The circuit 104 generally comprises a circuit (or module) 120 and a circuit (or module) 122. The circuit 120 generally receives the signal EN/DIS from the circuit 102 and exchanges the signal CPU_DATA with the circuit 102. An optional signal (e.g., INTR1) may be generated by the circuit 120 and presented to the circuit 102 as part of, or as the signal INTR. A signal (e.g., DATA_WORD) may be exchanged between the circuit 120 and the circuit 122.

The circuit 122 may receive the signal CPU_ADDR and the signal MODE from the circuit 102. An optional signal (e.g., INTR2) may be generated by the circuit 122 and presented to the circuit 102 as part of, or as the signal INTR. The circuit 122 may present the signal MEM_ADDR to the circuit 108 and exchange the signal MEM_DATA with the circuit 108. The circuit 122 may receive the signal BIST_ADDR from the circuit 106 and exchange the signal BIST_DATA with the circuit 106.

The circuit 120 may be implemented as an error correction code logic module. The circuit 120 is generally operational to (i) generate and append ECC codes to write data values received in the signal CPU_DATA, (ii) present the resulting write word to the circuit 122 in the signal DATA_WORD, (iii) parse read words received from the circuit 122 via the signal DATA_WORD into the read data values and read ECC codes, (iv) generate recovered ECC codes from the read data value, (v) compare the recovered ECC codes with the read ECC codes, (vi) correct the read data values and/or ECC codes if appropriate and (vii) flag detected errors by asserting the signal INTR1. In some embodiments, the circuit 120 may be designed to detect and correct at least single-bit errors. In other embodiments, the circuit 120 may be designed to detect two or more bit errors and correct one or more of the detected errors. In some embodiments, the circuit 120 may be implemented as a common ECC module.

The signal CPU_DATA may convey multi-bit data. For example, different embodiments may treat separate data values as 8-bit, 16-bit, 32-bit or 64-bit long values. A length of the ECC codes generally depends on the length of the data values. In particular, the ECC codes may have a 5-bit length for 8-bit data, a 6-bit length for 16-bit data, a 7-bit length for 32-bit data and an 8-bit length for 64-bit data. The resulting words in the signal DATA_WORD may be 13-bits, 22-bits, 39-bits and 72-bits long, respectively. Other ECC codes may be implemented to meet the criteria of a particular application.

The circuit 122 may be implemented as a compare logic module. The circuit 122 is generally operational to (i) selectively route information from among the signal DATA_WORD, BIST_DATA and internally stored predetermined words to the signal MEM_DATA, (ii) selectively route address values from the signal CPU_ADDR and the signal BIST_ADDR into the signal MEM_ADDR, (iii) store the predetermined word used to mark uninitialized memory locations in the circuit 108, (iv) store the predetermined information (ECC+data or ECC) used to detect a read cycle that accesses an uninitialized memory location, (v) route the read words from the signal MEM_DATA to the signal DATA_WORD and (vi) assert the signal INTR2 upon detection of a read from an uninitialized memory address. The signal INTR may be implemented as the signal INTR1 and/or the signal INTR2. A length of the predetermined word may match the length of the read/write words. A length of the predetermined ECC code may match a length of the corresponding ECC codes.

In some embodiments, the circuit 102 may not be specified to distinguish between an uninitialized memory access and a soft error detected during a read cycle. In such embodiments, the signal INTR may be created as a logical OR of the signal INTR1 and the signal INTR2. Therefore, the signal INTR may be (i) asserted while one or both of the signals INTR1 and INTR2 are asserted and (ii) deasserted while both signals INTR1 and INTR2 are deasserted. In some embodiments, the circuit 102 may distinguish between an uninitialized memory access and a soft error detected during a read cycle. Therefore, the signal INTR may be implemented as two independent interrupts, one for the signal INTR1 and another for the signal INTR2. In some embodiments, an uninitialized memory read may be detected by the circuit 120. In such cases, the signal INTR may be implemented as the signal INTR1 and the signal INTR2 may be eliminated.

Figure 3:
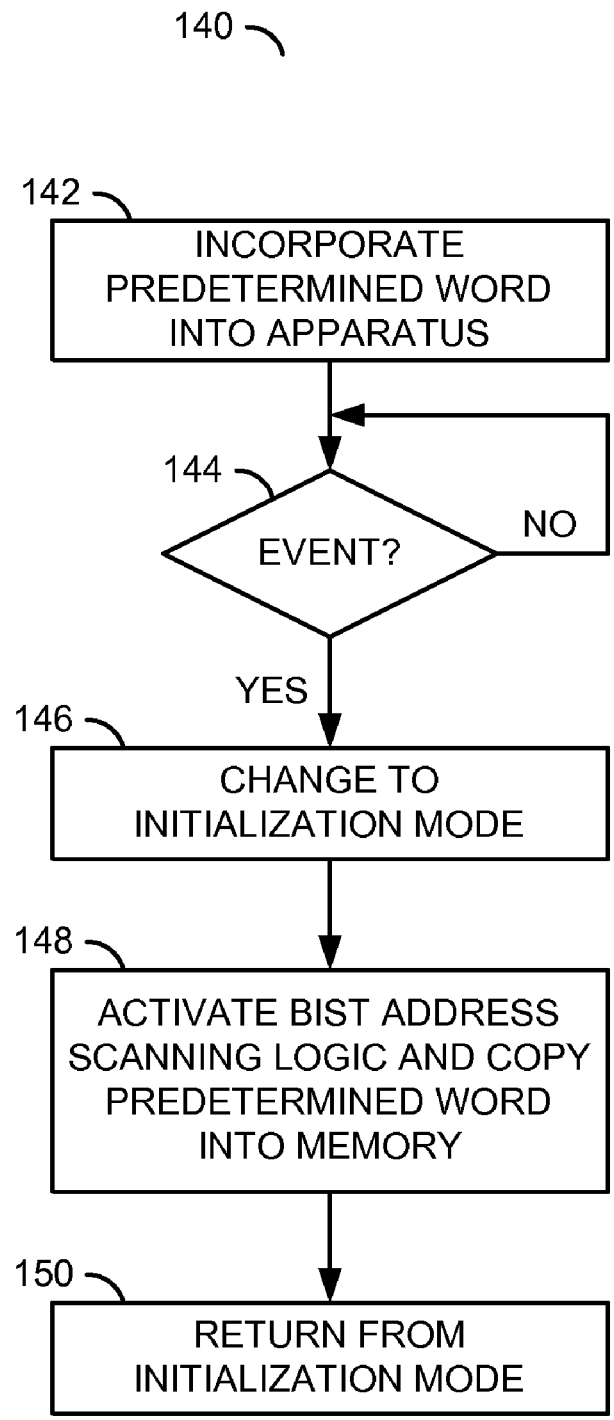
FIG. 3 is a flow diagram of an example implementation of an initialization method.

Referring to FIG. 3, a flow diagram of an example implementation of an initialization method 140 is shown. The method (or process) 140 generally comprises a step (or block) 142, a step (or block) 144, a step (or block) 146, a step (or block) 148 and a step (or block) 150. The method 140 may be performed by the apparatus 100.

In the step 142, a predetermined word (e.g., predetermined data and predetermined ECC code) may be incorporated into registers in the circuit 122. In some embodiments, the incorporation may be achieved by designing the predetermined word (e.g., a constant) into the circuit 104 or the circuit 106. In other embodiments, the incorporation may be involve loading a register, programming fuses, programming anti-fuses or the like. The flow may then loop around the step 144 waiting for a triggering event to occur. The triggering event generally indicates that some or all memory locations in one or more circuits 108 should be filled with the predetermined word as buffered in the registers.

Once a triggering event has occurred (e.g., the YES branch of step 144), the circuit 102 may change the signal MODE to the initialization mode in the step 146. The circuit 104 may respond to the initialization mode by selectively routing (i) the signal BIST_ADDR to the signal MEM_ADDR and (ii) the previously incorporated predetermined word to the signal MEM_DATA as part of the step 146. In the step 148, the circuit 102 may assert the signal ACTIVATION. The asserted signal ACTIVATION generally causes the circuit 106 to control one or more writes of the predetermined words to the memory locations determined by the signal BIST_ADDR thereby setting the memory locations to an uninitialized condition. In some embodiments, the entire memory may be scanned. In other embodiments, boundaries (e.g., start address and size, start address and end address, single address, etc) may be defined by registers in the circuit 106 to control the scanning to limited memory ranges. Once the initialization has completed, the circuit 102 may return the signal MODE to a previous state (e.g., the normal mode or the BIST mode) in the step 150.

Figure 4:
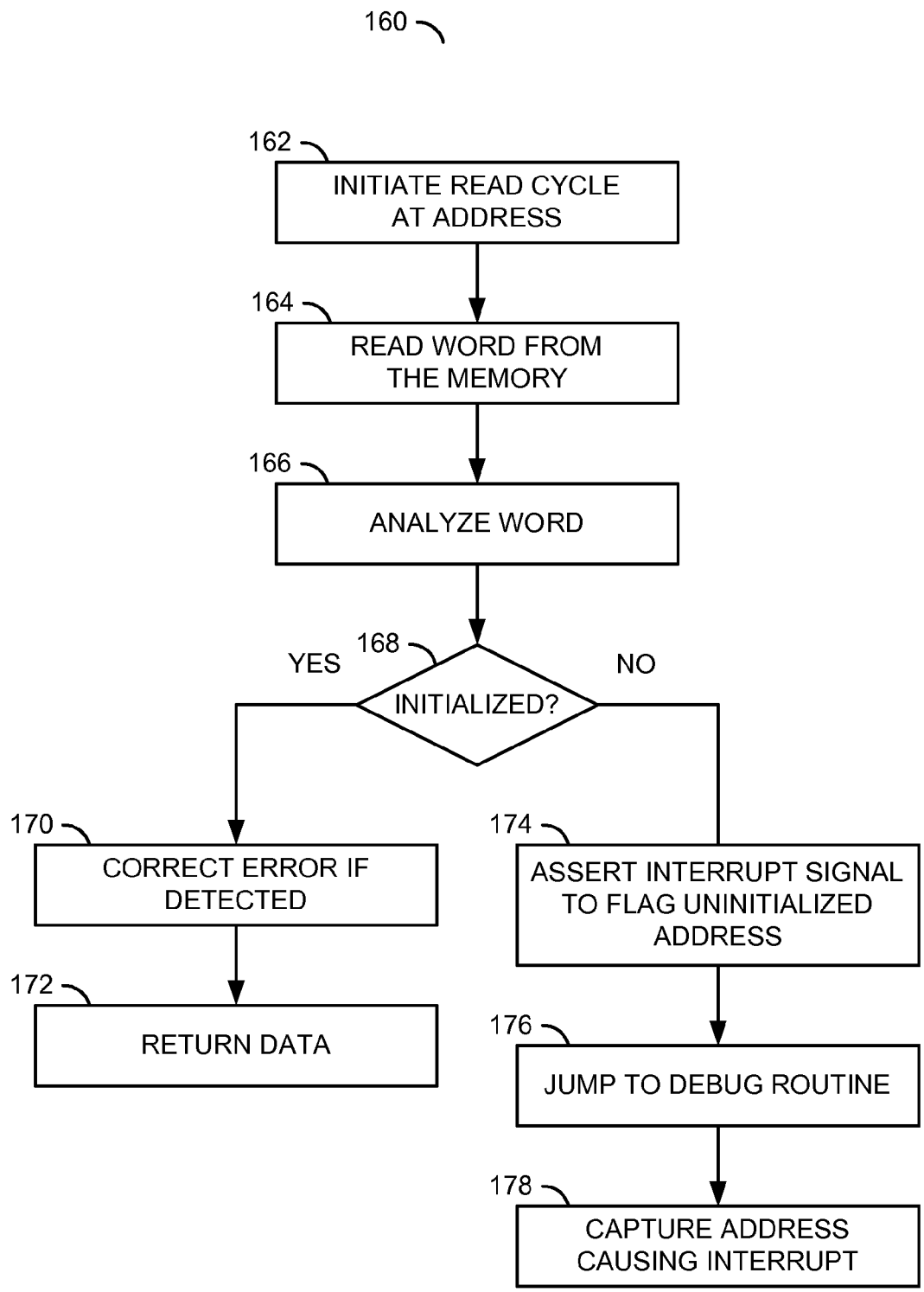
FIG. 4 is a flow diagram of an example implementation of an analysis method.

Referring to FIG. 4, a flow diagram of an example implementation of an analysis method 160 is shown. The method (or process) 160 generally comprises a step (or block) 162, a step (or block) 164, a step (or block) 166, a step (or block) 168, a step (or block) 170, a step (or block) 172, a step (or block) 174, a step (or block) 176 and a step (or block) 178. The method 160 may be performed by the apparatus 100.

In the step 162, the circuit 102 may initiate a read cycle and present the target read address location in the signal CPU_ADDR. The circuit 104 may respond to the read cycle by reading the word (e.g., read data value and read ECC code) from the module 108 in the step 164. In the step 166, the circuit 104 may analyze the read word to detect if the read word indicates an uninitialized memory location or not. If the read word is from an initialized memory location (e.g., the YES branch of step 168), the circuit 104 may then perform and error correction process in the step 170 if a correctable error was detected. The corrected data value may be returned to the circuit 102 via the signal CPU_DATA in the step 172.

If the read word indicates an uninitialized memory location (e.g., the NO branch of step 168), the circuit 104 may assert the signal INTR in the step 174. The circuit 102 may respond to the interrupt by suspending the current code execution and jumping to a corresponding interrupt service routine in the step 176. In the step 178, the circuit 102 may capture (save) the address that caused the memory access to the uninitialized location of the circuit 108. Engineers debugging the software may subsequently use the captured address to determine where and why the software attempted to read uninitialized information from the circuit 108.

Figure 5:
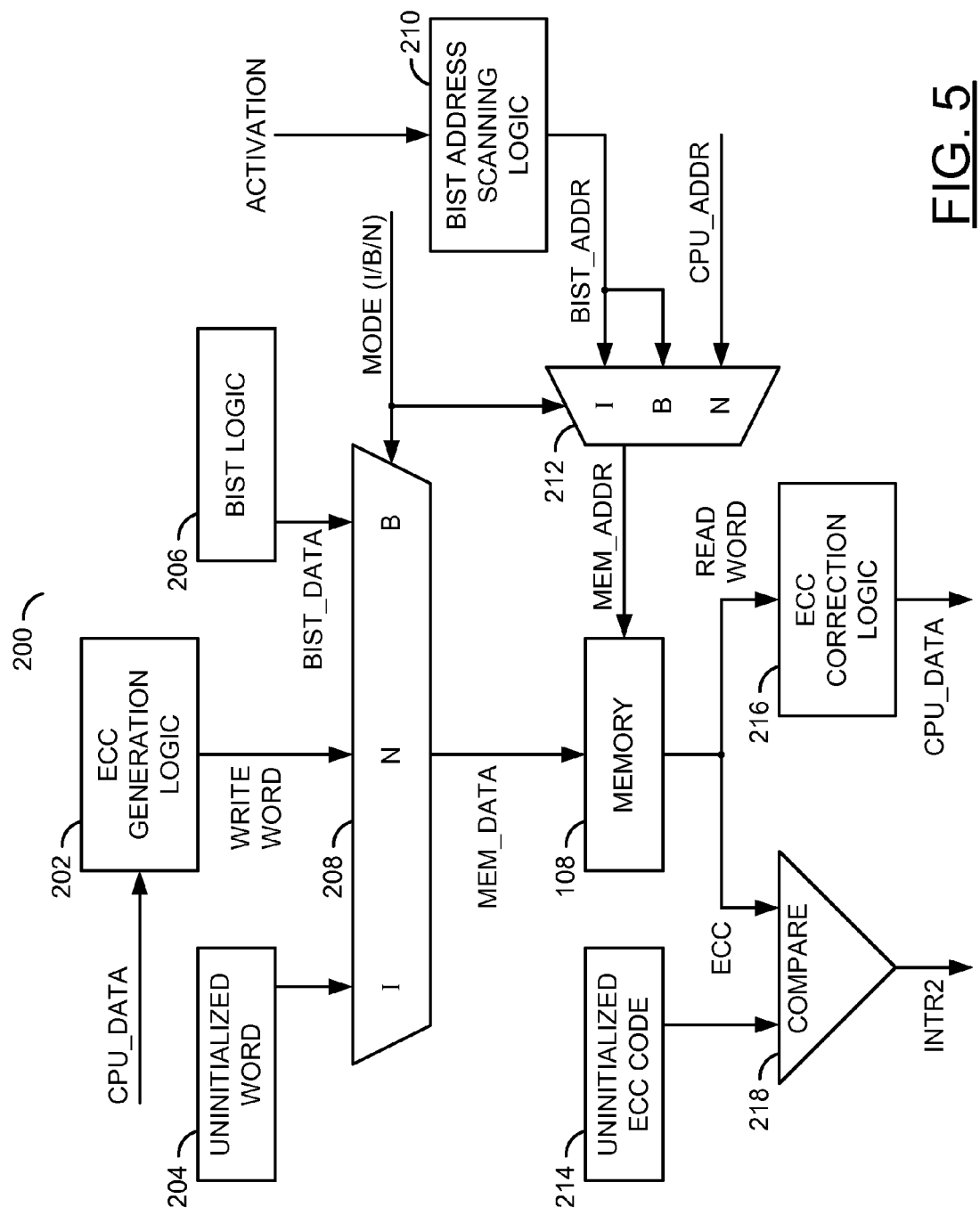
FIG. 5 is a functional flow diagram of a first example uninitialized memory detection operation.

Referring to FIG. 5, a functional flow diagram of a first example uninitialized memory detection operation 200 is shown. The operation 200 may be performed by the apparatus 100. The operations (or technique) 200 generally comprises a function (or module) 202, a function (or module) 204, a function (or module) 206, a function (or module) 208, a function (or module) 210, a function (or module) 212, a function (or module) 214, a function (or module) 216, a function (or module) 218 and the circuit 108. The functions 202 and 216 may be implemented by the circuit 120. The functions 204, 208, 212, 214 and 218 may be implemented by the circuit 122. The functions 206 and 210 may be implemented by the circuit 106.

In the initialization mode (e.g., I), a predetermined word may be routed from a storage function 204 to the circuit 108 through a multiplexer function 208. The multiplexer function 208 may select the predetermined word in response to the initialization mode value in the signal MODE. A sequence of one or more corresponding initialization addresses in the signal BIST_ADDR may be generated by the function 210. The multiplexer function 212 may route the signal BIST_ADDR to the signal MEM_ADDR. The multiplexer function 212 may select the BIST_ADDR input to generate the signal MEM_ADDR in response to the signal MODE. The circuit 108 may subsequently store the predetermined word in the initialization addresses.

In a normal mode (e.g., N), a write cycle may begin with the reception of a write data value at the circuit 120 via the signal CPU_DATA. The write data value may undergo an error correction coding operation in the function 202. The error correction coding generally calculates an ECC code from the write data value and then appends the ECC code to the write data value to create a write word in the signal DATA_WORD. The multiplexer function 208 may route the write word to the circuit 108 in response to the normal mode value received in the signal MODE. A write address received by the multiplexer function 212 via the signal CPU_ADDR may be routed to the circuit 108 in response to the signal MODE. The circuit 108 may then store the write word at the write address.

In the normal mode, a read cycle may begin with the circuit 102 presenting a read address in the signal CPU_ADDR to the circuit 122. The multiplexing function 212 in the circuit 122 may route the read address from the signal CPU_ADDR to the signal MEM_ADDR. The circuit 108 may present the accessed read word in the signal MEM_DATA back to the circuit 122. The compare function 218 may compare a stored (function 214) predetermined ECC code with the read ECC code parsed from the read word. If the predetermined ECC code matches the read ECC code, the function 218 may assert the signal INTR2. If the predetermined ECC code and the read ECC code do not match, the function 218 may present the signal INTR2 deasserted. The function 216 may perform an error detection and correction operation to fix any soft errors present in the read data value. The function 216 may then present the read data value in the signal CPU_DATA back to the circuit 102.

In a BIST mode (e.g., B), the multiplexer function 208 may route a BIST word (e.g., data+ECC) in the signal BIST_DATA from a BIST logic function 206 to the signal MEM_DATA. The multiplexer function 212 may route the address in the signal BIST_ADDR from the BIST address scanning logic function 210 to the signal MEM_ADDR in response to the signal MODE.

Figure 6:
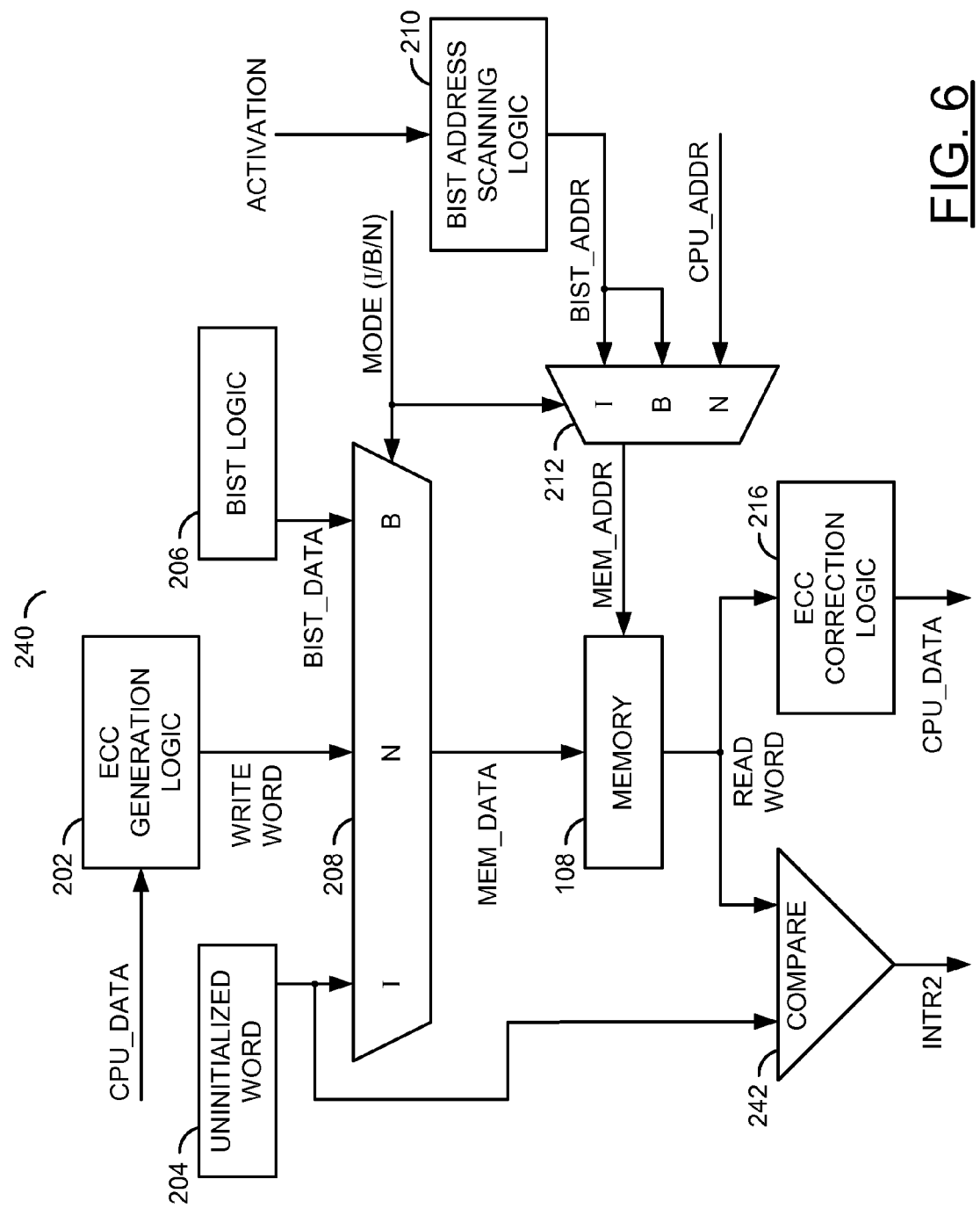
FIG. 6 is a functional flow diagram of a second example uninitialized memory detection operation.

Referring to FIG. 6, a functional flow diagram of a second example uninitialized memory detection operation 240 is shown. The operation 240 may be performed by the apparatus 100. The operations (or technique) 240 generally comprises the function (or module) 202, the function (or module) 204, the function (or module) 206, the function (or module) 208, the function (or module) 210, the function (or module) 212, the function (or module) 216, a function (or module) 242 and the circuit 108. The functions 202 and 216 may be implemented by the circuit 120. The functions 204, 208, 212 and 242 may be implemented by the circuit 122. The functions 206 and 210 may be implemented by the circuit 106.

The initialization mode of the operation 240 may be performed similar to that of the operation 200. The normal mode write cycle of the operation 240 may be performed similar to that of the operation 200. The BIST mode of the operation 240 may be performed similar to that of the operation 200. The normal mode read cycle of the operation 240 may differ from that of the operation 200 by comparing the entire read word with the entire predetermined word, instead of comparing only the two ECC codes.

In the normal mode, a read cycle may begin with the circuit 102 presenting a read address in the signal CPU_ADDR to the circuit 122. The multiplexing function 212 in the circuit 122 may route the read address from the signal CPU_ADDR to the signal MEM_ADDR. The compare function 242 may compare the stored (function 204) predetermined word with the read word. If the predetermined word matches the read word, the function 242 may present the signal INTR2 in the asserted condition. If the predetermined word and the read word do not match, the function 242 may present the signal INTR2 deasserted. The function 216 may perform an error detection and correction operation to fix any soft errors present in the read data value. The function 216 may then present the addressed read data value in the signal CPU_DATA back to the circuit 102.

Figure 7:
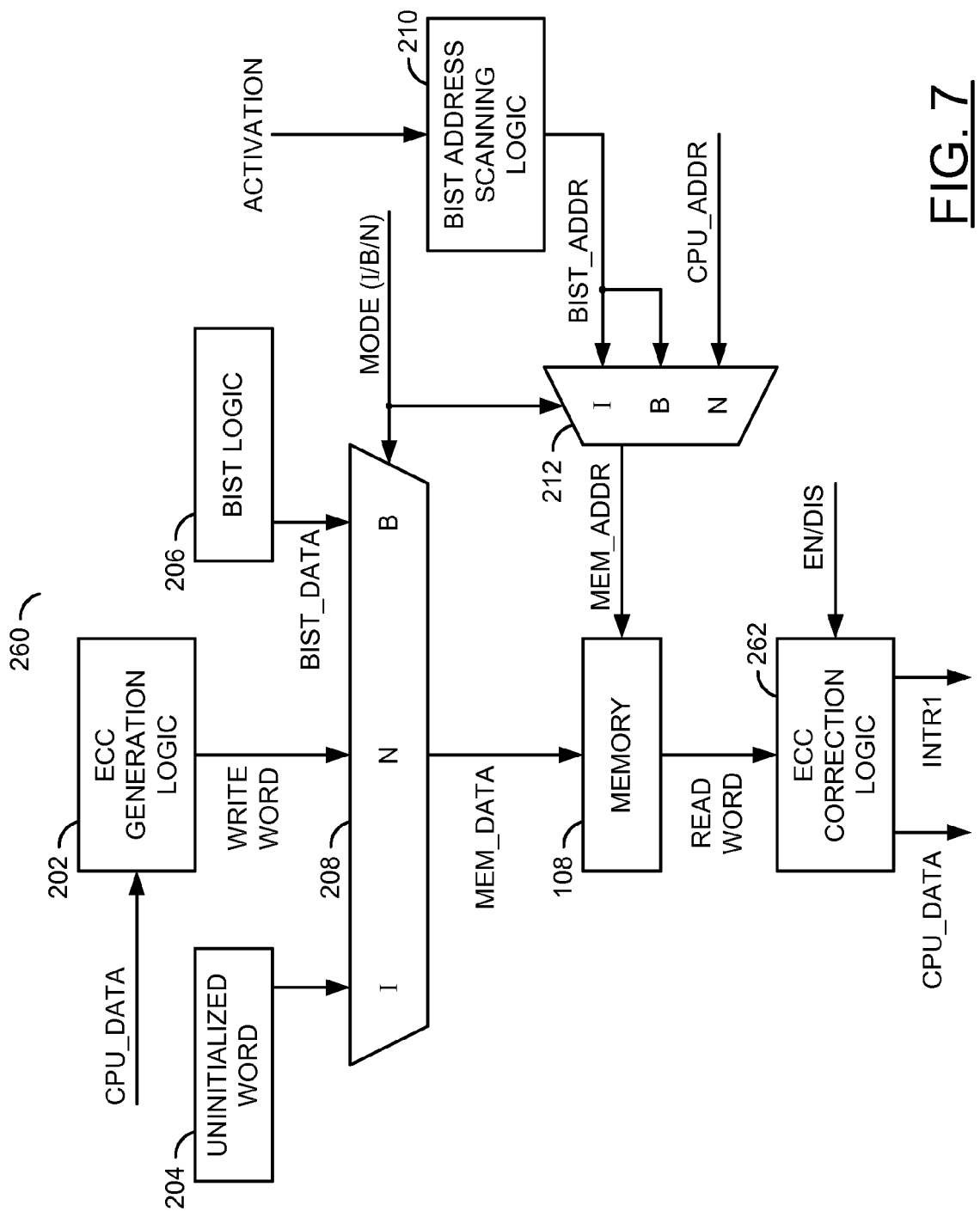
FIG. 7 is a functional flow diagram of a third example uninitialized memory detection operation.

Referring to FIG. 7, a functional flow diagram of a third example uninitialized memory detection operation 260 is shown. The operation 260 may be performed by the apparatus 100. The operations (or technique) 260 generally comprises the function (or module) 202, the function (or module) 204, the function (or module) 206, the function (or module) 208, the function (or module) 210, the function (or module) 212, a function (or module) 262 and the circuit 108. The functions 202 and 262 may be implemented by the circuit 120. The functions 204, 208 and 212 may be implemented by the circuit 122. The functions 206 and 210 may be implemented by the circuit 106.

The initialization mode of the operation 260 may be performed similar to that of the operation 200. The normal mode write cycle of the operation 260 may be performed similar to that of the operation 200. The BIST mode of the operation 260 may be performed similar to that of the operation 200. The normal mode read cycle of the operation 260 may differ from that of the operation 200 by using the ECC correction function 262 to provide both (i) error detection and correction of the read data value and (ii) generation of the interrupt to indicate a read from an uninitiated memory location.

In the normal mode, a read cycle may begin with the circuit 102 presenting a read address in the signal CPU_ADDR to the circuit 122. The multiplexing function 212 in the circuit 122 may route the read address from the signal CPU_ADDR to the signal MEM_ADDR. The circuit 108 may present the addressed read word in the signal MEM_DATA back to the circuit 122. The function 262 may perform an error detection and correction operation (if enabled) to fix any soft errors present in the read data value. The function 262 may also generate the signal INTR1 based on the results of the error detection. If an error was detected in the read word, the signal INTR1 may be asserted to notify the circuit 102 that an uninitialized memory location was accessed. If no errors were detected in the read word, the function 262 may present the signal INTR1 deasserted. The error correction portion of the function 262 may be optionally disabled by the signal EN/DIS (e.g., in a disabled state) to prevent the read data value from being corrected.

Figure 8:
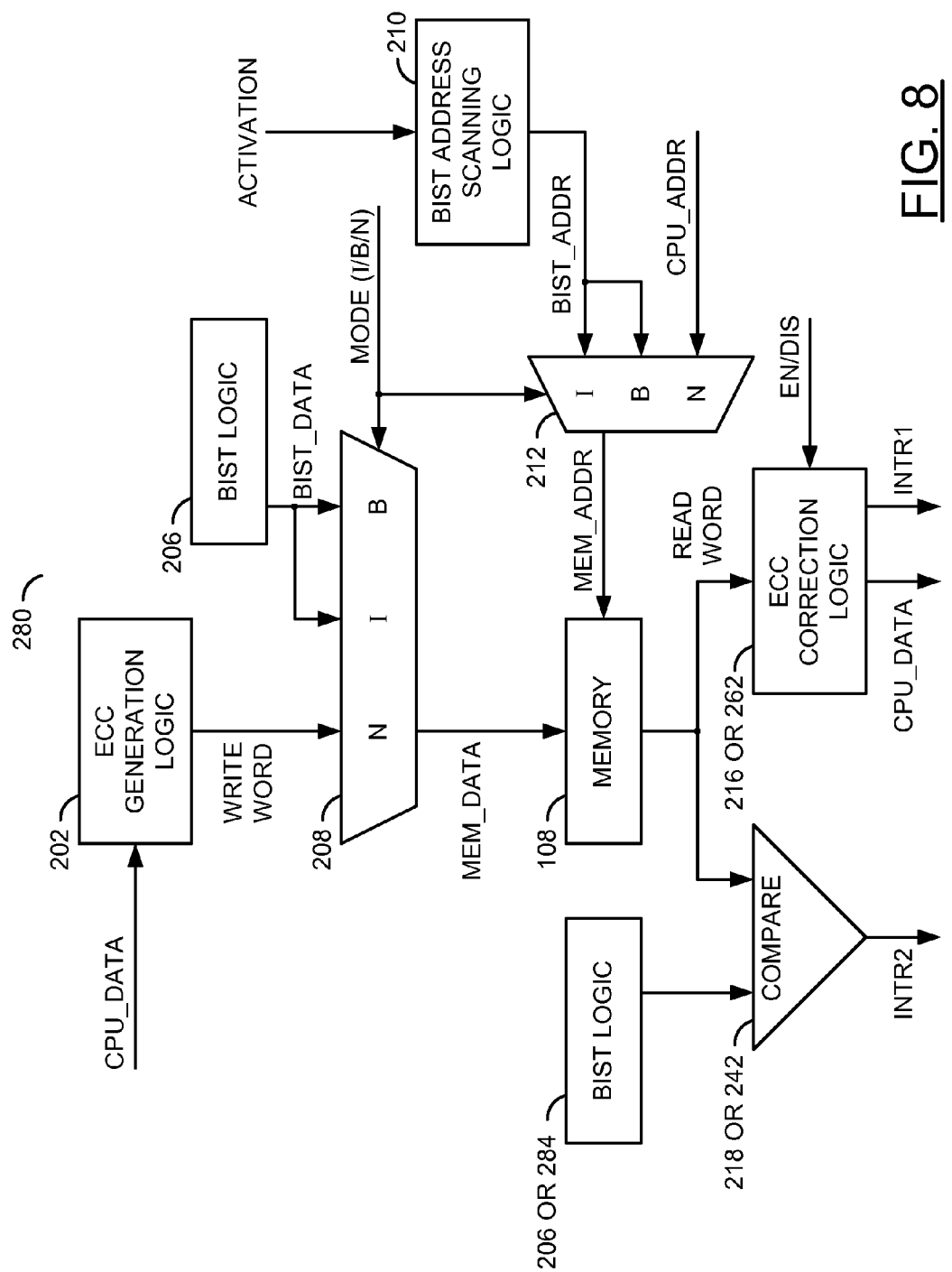
FIG. 8 is a functional flow diagram of a fourth example uninitialized memory detection operation.

Referring to FIG. 8, a functional flow diagram of a fourth example uninitialized memory detection operation 280 is shown. The operation 280 may be performed by the apparatus 100. The operations (or technique) 280 generally comprises the function (or module) 202, the function (or module) 206, the function (or module) 208, the function (or module) 210, the function (or module) 212, the function (or module) 216 or 262, the function (or module) 218 or 242, a function (or module) 282, a function (or module) 284 and the circuit 108. The functions 206, 210, 282 and 284 may be implemented by the circuit 106.

The normal mode write cycle of the operation 280 may be performed similar to that of the operation 200. The BIST mode of the operation 280 may be performed similar to that of the operation 200. The normal mode read cycle of operation 280 may be performed similar to that of the operation 200, the operation 240 or the operation 260.

The initialization mode of the operation 280 may be performed similar to that of the operation 200 with a few differences. The function 206 of the circuit 106 may provide the predetermined word in the signal BIST_DATA to the circuit 122, instead of the predetermined word being stored (function 204) inside the circuit 122. Therefore, the operation 280 may allow multiple different predetermined words to be used to mark locations in the circuit 108 as uninitialized. In some embodiments, the function 206 may also provide the predetermined word to the function 242 for comparison with the read word received from the circuit 108. In other embodiments, the function 284 of the circuit 106 may provide the predetermined ECC code to the function 218 for comparison with the ECC code received from the circuit 108.

Several different methods may be used to create the predetermined ECC code and the predetermined words used in detecting the uninitialized memory sets. Systems that implement an ECC technique always have at least one, and in practice many illegal combinations of ECC bits and data bits. For example, considering all possible data values resulting in an N-bit ECC code, fewer than $2^N$ valid values generally exist. Thus, the predetermined ECC code may be any one of the illegal or non-valid values of the N-bit ECC code. If the N-bit ECC code has $2^N$ valid values, the ECC code may be increased by a single bit resulting in $2^{N+1}$ possible values, thereby allowing invalid values to be established. Once the non-valid ECC code has been created, the predetermined word may be formed by incorporating or appending the non-valid ECC code with any default (e.g., zero) data value. Likewise, a predetermined word may be formed by intentionally corrupting a valid data+ECC combination.

The following technique may be used to create the predetermined ECC codes and the predetermined words:
1. Choose any arbitrary data value.
2. Calculate a matching ECC value (each data generally has a unique ECC value).
3. Invert a single bit, either one of the ECC bits or one of the data value bits, to create an illegal word (data+ECC) that the system could detect and possibly correct during a read cycle. In some embodiments, the predetermined words may be suitable for detecting reads from uninitialized memory locations is limited to a testing environment (e.g., the BIST mode) and minimal concern exists for rare soft errors. In some embodiments where the soft errors may be ignored, the ECC correction logic (e.g., 262) may be neutralized during tests. Instead of correcting the errors in the data values, the ECC correction logic may generate interrupts via the signal INTR1 to alert the apparatus of read accesses to uninitialized locations. The above approach may be useful in embodiments where the ECC correction logic may detect and correct a single-bit error but may not detect double-bit or multiple-bit errors.

Another technique may be used to create the predetermined ECC codes and the predetermined words as follows:
1. Choose any arbitrary data value.
2. Calculate a matching ECC value.
3. Invert any 2 bits between the ECC bits and the data bits to create the predetermined word. Many common ECC systems are generally capable of detecting 2-bit errors but may be unable to perform a correction that recovers the original data. Such 2-bit corrupted words generally produce an illegal combination that allows the ECC correction logic to assert the signal INTR1. The interrupt may inform the apparatus 100 that the corrupted data was accessed and could not be corrected. The 2-bit corrupted words may also be used as the predetermined word in the test environment. The above approach may be useful in embodiments implementing common ECC systems (e.g., the ECC system implemented in the StarCore processor and other processors) that may correct single-bit errors and detect both single-bit and double-bit errors.

A benefit of using the ECC correction logic to detect the predetermined words is that some logic (e.g., compare 220 or compare 242) may be excluded from the apparatus design. The detection of the accesses to uninitialized addresses may be performed by regular ECC detection logic. In the normal mode, when reading a data word with two corrupted bits, the interrupt service routine usually resets the apparatus. In a special debug mode, the interrupt service routine may (i) report that an uninitialized location has been accessed and (ii) store the corresponding address without resetting the apparatus.

For ECC systems that may detect and correct double-bit errors, the predetermined word may be created by inverting three or more bits. Generally, more bits should be inverted than the ECC system may correct. However, only a sufficient number of bits should be inverted such that the ECC may still detect all words containing the errors.

Some embodiments of the present invention generally use a reserve (predetermined) code to define uninitialized addressable memory locations. When powering up, performing a task switching operation or releasing memory, the operating system may run a special sequence that activates a hardware initialization of some or all of the addressable memory space to the specific uninitialized reserved code. The hardware may use a BIST logic machine, normally used in testing, to quickly fill a whole target address range in one or more memory modules. In some embodiments, a "scan-and-fill" machine may be implemented to control the initialization sequence. As such, a fast initialization of the memory modules may be achieved. Subsequent detection of the specific reserve code in the memory may assert a detection signal. The detection signal may be utilized as an interrupt or a debug request.

The functions performed by the diagrams of FIGS. 1-8 may be implemented using a conventional general purpose processor, digital computer, microprocessor, microcontroller, RISC (reduced instruction set computer) processor, CISC (complex instruction set computer) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules can readily be prepared by skilled programmers based on the teachings of the present disclosure, as will also be apparent to those skilled in the relevant art(s). The software is generally executed from medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products) or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which can be used to program a machine to perform one or more processes or methods in accordance with the present invention. Execution of the computer product by the machine, along with operations of surrounding circuitry, transforms input data into one or more files on a recording medium and/or one or more output signals representative of a physical object or substance, such as a visual depiction. The storage medium can include, but is not limited to, any type of disk including floppy disk, hard drive, magnetic disk, optical disk, CD-ROM, DVD, magneto-optical disks, ROMs (read-only memories), RAMs (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:
1. An apparatus comprising:
a memory module; and
an initialization module configured to (i) mark a particular location in said memory module as an uninitialized location by writing a particular word into said particular location, (ii) read a read word from a given address in said memory module and (iii) generate an interrupt signal by analyzing said read word, said interrupt signal being asserted where said read word indicates that said given address is said uninitialized location in said memory module, and said particular word comprising a particular error correction code that cannot be generated by an error correction code technique of said apparatus applied to all possible values of data in said read word.

2. The apparatus according to claim 1, further comprising a built-in self test module configured to transfer an address of said particular location to said initialization module in response to an event.

3. The apparatus according to claim 2, wherein said built-in self test module is further configured to transfer said particular word to said initialization module.

4. The apparatus according to claim 1, wherein said initialization module analyzes said read word by comparing said read word with said particular word, said interrupt signal being (i) asserted where said read word matches said particular word and (ii) deasserted otherwise.

5. The apparatus according to claim 1, wherein said initialization module is further configured to (a) parse a read error correction code from said read word and (b) analyze said read word by comparing said read error correction code with said particular error correction code, said interrupt signal being (1) asserted where said read error correction code matches said particular error correction code and (2) deasserted otherwise.

6. The apparatus according to claim 1, wherein said initialization module is further configured to (a) parse a read data value and a read error correction code from said read word, (b) generate a recovered error correction code from said read data value and (c) analyze said read word by comparing said recovered error correction code and said read error correction code, said interrupt signal being (1) asserted where said recovered error correction code does not match said read error correction code and (2) deasserted otherwise.

7. The apparatus according to claim 6, wherein said initialization module is further configured to (i) enable correction of said read data value using said read error correction code while in a normal mode and (ii) disable said correction of said read data value while in a non-normal mode.

8. The apparatus according to claim 1, further comprising a processor module configured to capture said given address in response to said assertion of said interrupt signal when reading said given address from said memory module.

9. The apparatus according to claim 1, wherein said error correction code technique is configured to (i) generate a write error correction code corresponding to a write data value and (ii) generate a write word by appending said write error correction code to said write data value.

10. The apparatus according to claim 1, wherein said initialization module is further configured to write into said memory module (i) one or more write words while in a normal mode and (ii) said particular word while in an initialization mode.

11. The apparatus according to claim 1, wherein said particular error correction code comprises a predetermined value.

12. The apparatus according to claim 1, wherein said initialization module is further configured to perform said error correction code technique on one or more write data values.

13. A method of detecting uninitialized memory, comprising the steps of:
(A) marking a particular location in a memory module as an uninitialized location by writing a particular word into said particular location;
(B) reading a read word from a given address in said memory module; and
(C) generating an interrupt signal by analyzing said read word, said interrupt signal being asserted where said read word indicates that said given address is said uninitialized location in said memory module, and said particular word comprising a particular error correction code that cannot be generated by an error correction code technique of said method applied to all possible values of data in said read word.

14. The method according to claim 13, wherein said analysis is performed at all of a plurality of addressable locations of said memory module.

15. The method according to claim 13, further comprising the step of:
capturing said given address in a processor module in response to said assertion of said interrupt signal when reading said given address from said memory module.

16. The method according to claim 13, wherein analyzing said read word comprises comparing said read word with said particular word, said interrupt signal being (i) asserted where said read word matches said particular word and (ii) deasserted otherwise.

17. The method according to claim 13, further comprising the step of:
parsing a read error correction code from said read word, wherein analyzing said read word comprises comparing said read error correction code with said particular error correction code, said interrupt signal being (i) asserted where said read error correction code matches said particular error correction code and (ii) deasserted otherwise.

18. The method according to claim 13, further comprising the steps of:
parsing a read data value and a read error correction code from said read word; and
generating a recovered error correction code from said read data value, wherein analyzing said read word comprises comparing said recovered error correction code and said read error correction code, said interrupt signal being (i) asserted where said recovered error correction code does not match said read error correction code and (ii) deasserted otherwise.

19. The method according to claim 18, further comprising the steps of:
enabling correction of said read data value using said read error correction code while in a normal mode; and
disabling said correction of said read data value while in a non-normal mode.

20. An apparatus comprising:
means for storing; and
means for (i) marking a particular location in said means for storing as an uninitialized location by writing a particular word into said particular location, (ii) reading a read word from a given address in said means for storing, (iii) generating an interrupt signal by analyzing said read word, said interrupt signal being asserted where said read word indicates that said given address is said uninitialized location in said means for storing, and said particular word comprising a particular error correction code that cannot be generated by an error correction code technique of said apparatus applied to all possible values of data in said read word.

* * * * *